US012049178B2

(12) United States Patent
Jones et al.

(10) Patent No.: US 12,049,178 B2
(45) Date of Patent: Jul. 30, 2024

(54) ELECTRICAL SYSTEM

(71) Applicant: Lear Corporation, Southfield, MI (US)

(72) Inventors: Jeffrey A. Jones, Ann Arbor, MI (US); Antoine Moulin, Aurec-sur-Loire (FR); Raúl Ricart, Valls (ES); Antoni Ferré Fàbregas, Tarragona (ES); Jose Gabriel Fernández Bañares, Valls (ES)

(73) Assignee: Lear Corporation, Southfield, MI (US)

( * ) Notice: Subject to any disclaimer, the term of this patent is extended or adjusted under 35 U.S.C. 154(b) by 619 days.

(21) Appl. No.: 17/185,063

(22) Filed: Feb. 25, 2021

(65) Prior Publication Data

US 2021/0268974 A1 Sep. 2, 2021

Related U.S. Application Data

(60) Provisional application No. 62/982,990, filed on Feb. 28, 2020.

(51) Int. Cl.
*B60R 16/023* (2006.01)
*B60N 2/02* (2006.01)
(Continued)

(52) U.S. Cl.
CPC ...... *B60R 16/0232* (2013.01); *B60N 2/02246* (2023.08); *B60N 2/07* (2013.01);
(Continued)

(58) Field of Classification Search
CPC .. B60N 2/002; B60N 2002/0272; B60N 2/43; B60K 6/40; G05B 23/0286
See application file for complete search history.

(56) References Cited

U.S. PATENT DOCUMENTS 5,804,887 A    9/1998   Holzapfel et al.
7,479,749 B2   1/2009   Gerding et al.
(Continued)

FOREIGN PATENT DOCUMENTS

CN    104742834 A    7/2015
DE    19615321 A1    10/1997
(Continued)

OTHER PUBLICATIONS

German Office Action dated Apr. 5, 2022 for German Patent Application No. 10 2021 104 694.7.
(Continued)

*Primary Examiner* — Mirza F Alam
(74) *Attorney, Agent, or Firm* — McGarry Bair PC

(57) ABSTRACT

An electrical system includes a movable component configured for selective connection with and selective removal from a mounting surface. The movable component may include a first electronic control unit (ECU), and an electromechanical interface configured for selectively locking the movable component with said mounting surface. The electrical system may include a second ECU configured to communicate with the first ECU, and/or a third ECU configured to detect a potential dynamic event via one or more sensors. The third ECU may be configured to provide dynamic event information to the second ECU. The second ECU may be configured to provide disable information corresponding to the dynamic event information to the movable component. The first ECU may be configured to lock the movable component with the mounting surface according to the disable information.

18 Claims, 5 Drawing Sheets

(51) Int. Cl.
*B60N 2/07* (2006.01)
*B60N 2/56* (2006.01)
*B60N 2/66* (2006.01)
*B60N 2/90* (2018.01)
*H05K 7/14* (2006.01)

(52) U.S. Cl.
CPC ......... *B60N 2/5621* (2013.01); *B60N 2/5678* (2013.01); *B60N 2/665* (2015.04); *B60N 2/976* (2018.02); *H05K 7/14* (2013.01)

(56) References Cited

U.S. PATENT DOCUMENTS

| | | | |
|---|---|---|---|
| 7,873,473 | B2 | 1/2011 | Baumann et al. |
| 8,998,325 | B2 | 4/2015 | Jonsson |
| 10,011,194 | B1 | 7/2018 | Scott et al. |
| 10,124,778 | B1 | 11/2018 | Forwerck |
| 10,239,420 | B2 | 3/2019 | Yetukuri et al. |
| 2005/0149242 | A1 | 7/2005 | Pavlish |
| 2008/0157940 | A1 | 7/2008 | Breed |
| 2009/0299576 | A1* | 12/2009 | Baumann ............ B60R 21/0134 701/45 |
| 2016/0097224 | A1* | 4/2016 | Fernandez-Aguilera .................... E05B 77/02 701/45 |
| 2017/0334437 | A1* | 11/2017 | Mikami ................ B60W 20/50 |
| 2019/0232909 | A1 | 8/2019 | Lamesch et al. |
| 2019/0248315 | A1 | 8/2019 | Oesterle et al. |
| 2020/0062146 | A1 | 2/2020 | Freienstein et al. |
| 2021/0301562 | A1* | 9/2021 | Cumbo .................. E05B 79/08 |
| 2022/0314929 | A1* | 10/2022 | Kato ....................... B60R 25/24 |

FOREIGN PATENT DOCUMENTS

| | | |
|---|---|---|
| DE | 19743313 C1 | 12/1998 |
| DE | 10145307 A1 | 4/2003 |
| DE | 10164068 A1 | 4/2003 |
| DE | 102006030729 A1 | 1/2008 |
| DE | 102018116719 A1 | 1/2019 |
| DE | 112017005187 T5 | 7/2019 |
| DE | 102019114993 A1 | 1/2020 |
| DE | 102020203147 A1 | 1/2021 |
| DE | 102019124295 A1 | 3/2021 |
| DE | 102020001264 A1 | 6/2021 |

OTHER PUBLICATIONS

Office Action in corresponding Chinese application, CN202110227811.5, dated Feb. 1, 2024.

* cited by examiner

ELECTRICAL SYSTEM

CROSS-REFERENCE TO RELATED APPLICATION

This application claims the benefit of U.S. Provisional Patent Application Ser. No. 62/982,990, filed on Feb. 28, 2020, the disclosure of which is hereby incorporated by reference in its entirety as though fully set forth herein.

TECHNICAL FIELD

The present disclosure generally relates to electrical systems, including electrical systems that may, for example, be used in connection with vehicles, tracks, and/or seats.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical systems are not sufficiently robust, do not provide sufficient functionality, and/or are not configured for efficiently handling dynamic events.

There is a desire for solutions/options that minimize or eliminate one or more challenges or shortcomings of electrical systems. The foregoing discussion is intended only to illustrate examples of the present field and is not a disavowal of scope.

SUMMARY

In embodiments, an electrical system may include a movable component configured for selective connection with and selective removal from a mounting surface. The movable component may include a first electronic control unit (ECU) and an electromechanical interface configured for selectively locking the movable component with said mounting surface. The electrical system may include a second ECU configured to communicate with the first ECU, and/or a third ECU configured to detect a potential dynamic event via one or more sensors. The third ECU may be configured to provide dynamic event information to the second ECU. The second ECU may be configured to provide disable information corresponding to the dynamic event information to the movable component. The first ECU may be configured to activate the electromechanical interface to lock the movable component with the mounting surface according to (e.g., using, based on, pursuant to, etc.) the disable information.

With embodiments, a method of operating an electrical system may include detecting a potential dynamic event, providing disable information to a movable component, locking the movable component with a mounting surface in response to the disable information, providing activation information to the movable component, and/or activating a safety device associated with the movable component according to the activation information after locking the movable component.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
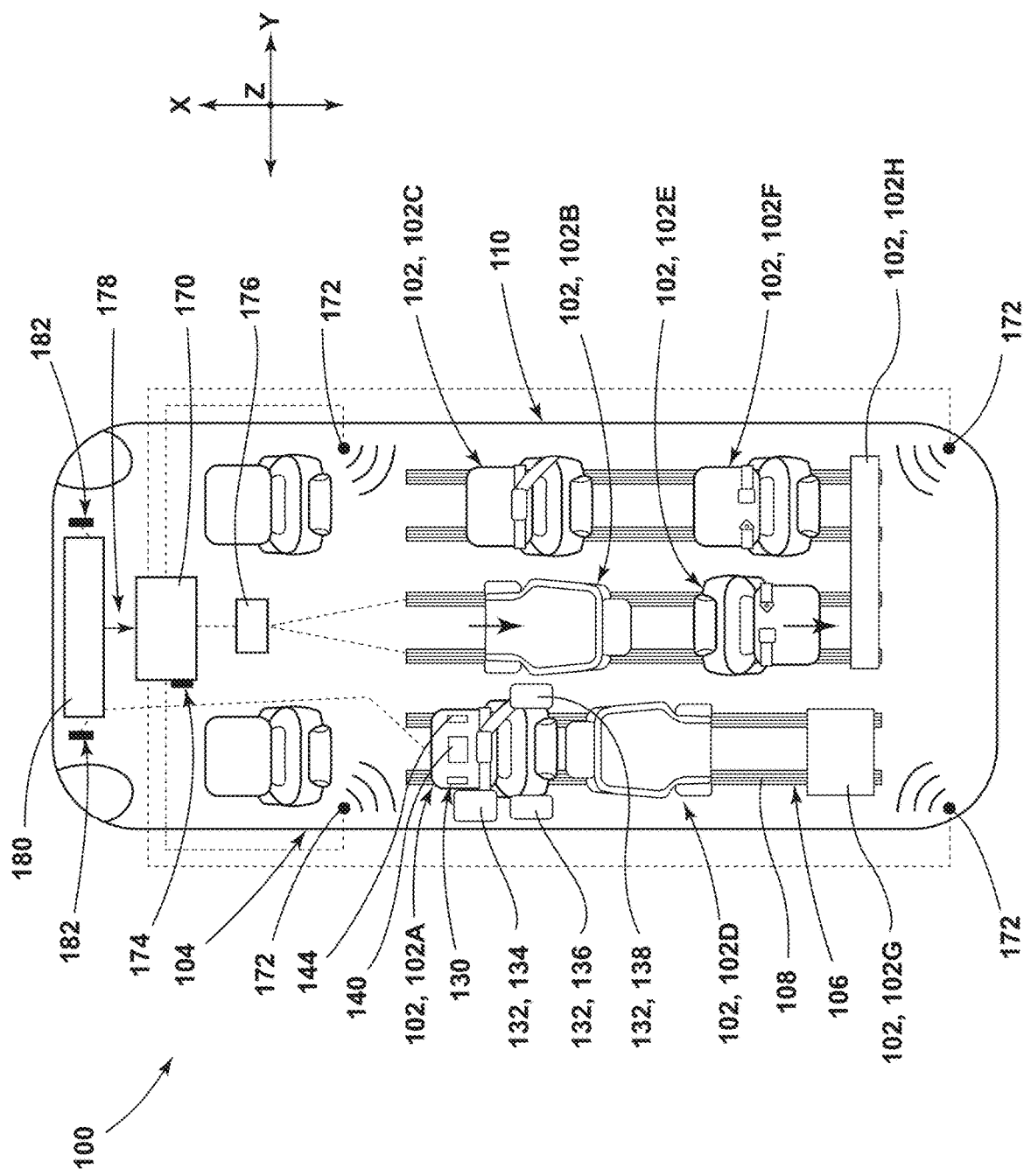
FIG. 1 is a schematic view generally illustrating an embodiment of an electrical system according to teachings of the present disclosure.
Figure 4:
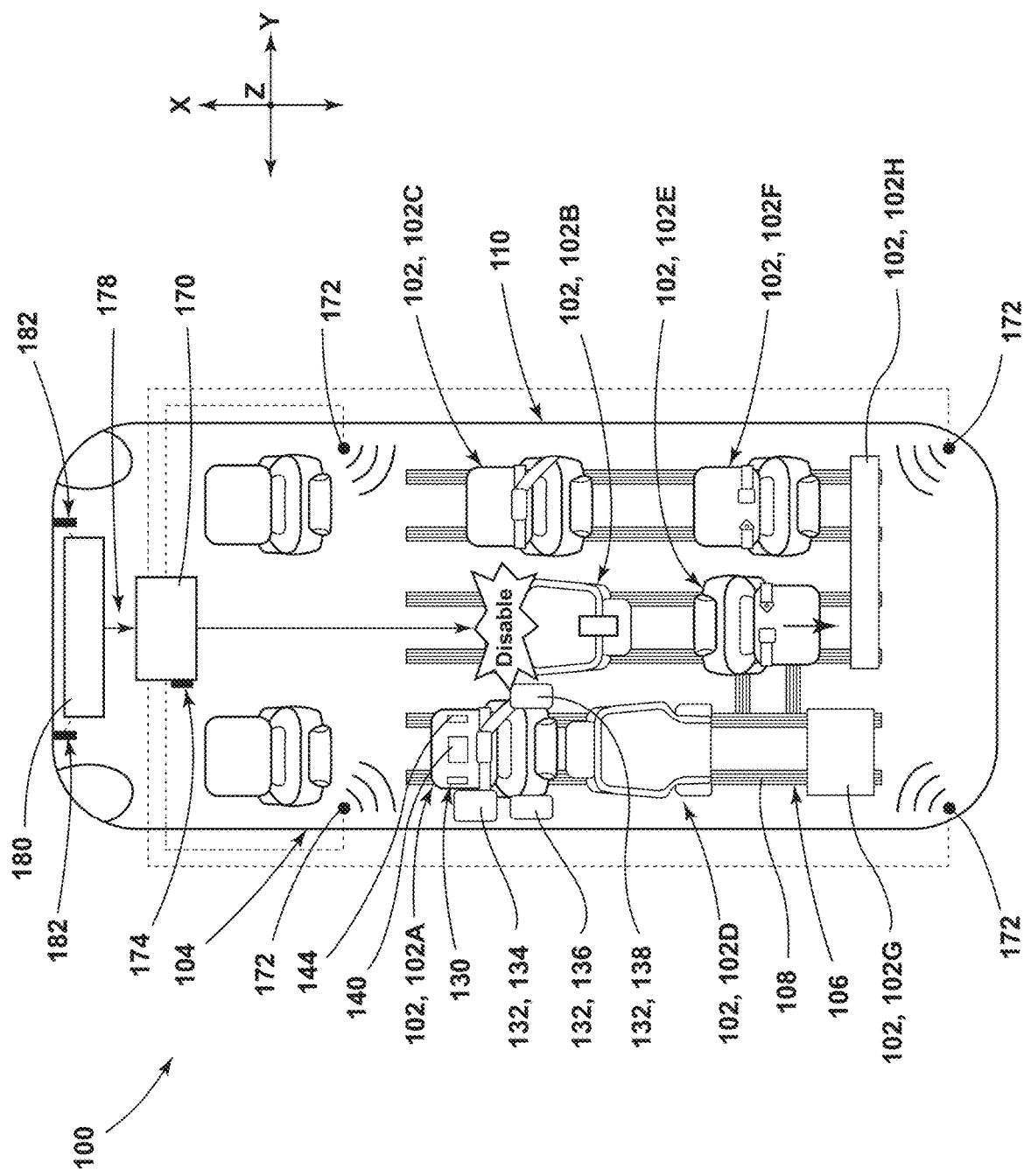
FIG. 4 is a schematic view generally illustrating an embodiment of an electrical system according to teachings of the present disclosure.

In embodiments, such as generally illustrated in FIGS. 1 and 4, an electrical system 100 may include one or more movable components 102 that may be configured to move relative to a mounting surface 104.

In embodiments, such as generally illustrated in FIGS. 1 and 4, a mounting surface 104 may include a track/rail assembly/system 106 having one or more tracks/rails 108 that may, for example, extend substantially in an X-direction, a Y-direction, a Z-direction, and/or one or more angles thereto. The mounting surface 104 may, for example and without limitation, include and/or be a portion of a vehicle 110 (e.g., a vehicle floor).

With embodiments, such as generally illustrated in FIGS. 1 and 4, a movable component 102 may include one or more of a variety of shapes, sizes, configurations, and/or materials. For example and without limitation, a movable component 102 may include a seat (e.g., movable components 102A-102F), a console (e.g., movable component 102G), and/or a cargo rack (e.g., movable component 102H), among others. A movable component 102 may include a first electronic control unit (ECU) 130.

In embodiments, such as generally illustrated in FIGS. 1-4, a movable component 102 may include one or more safety devices 132. A safety device 132 may include, for example, an airbag 134, a pyrotechnic device 136, and/or a seat belt pretensioner 138, among others. FIGS. 1 and 4 show the movable component 102A with a first ECU 130, a safety device 132, an airbag 134, a pyrotechnic device 136, and/or a seat belt pretensioner 138. One or more of the other movable components 102B-102H may include a respective first ECU 130, safety device 132, airbag 134, pyrotechnic device 136, and/or seat belt pretensioner 138, among others.

Figure 2:
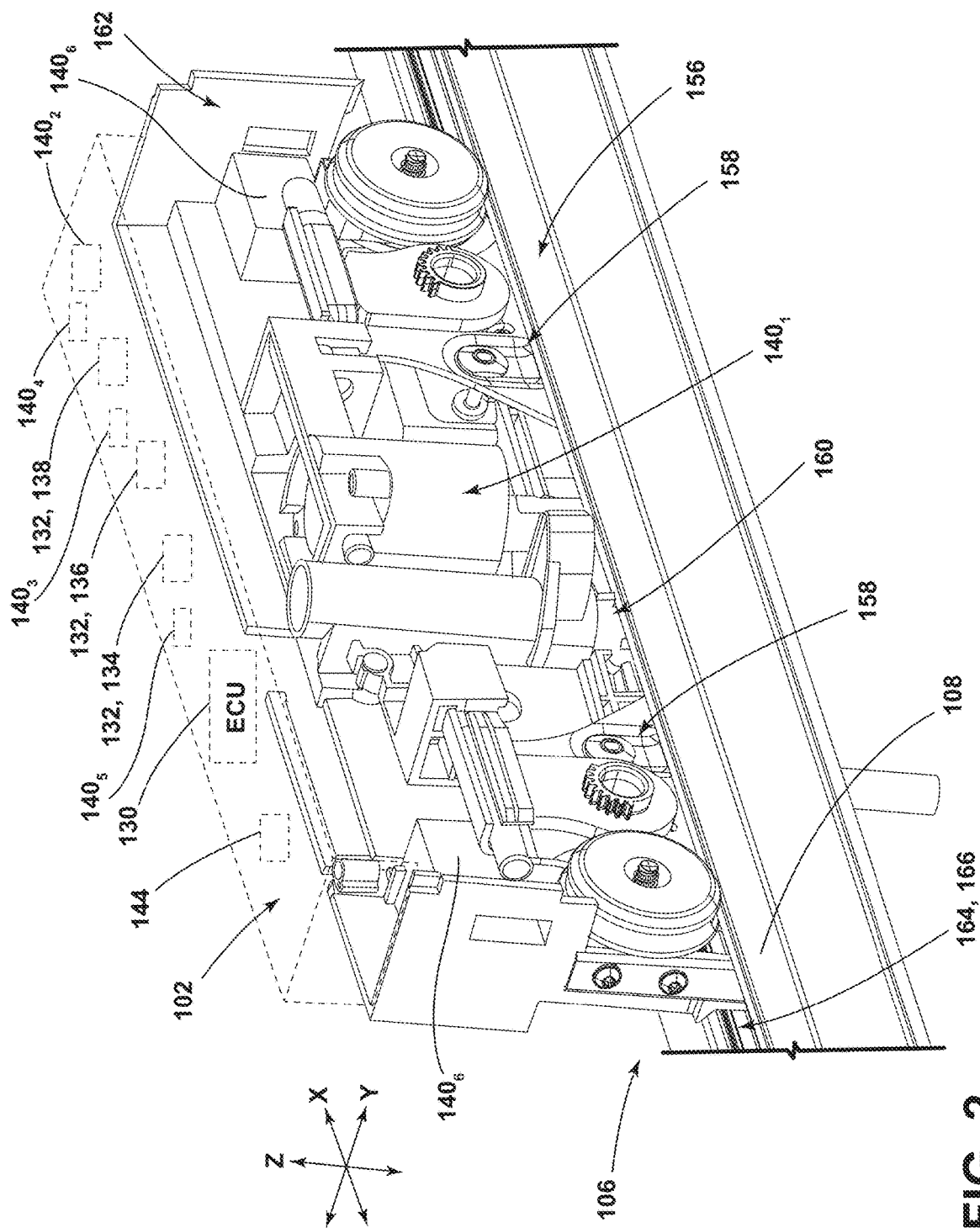
FIG. 2 is a perspective view generally illustrating portions of embodiments of a movable component and a track assembly of an electrical system according to teachings of the present disclosure.
Figure 3:
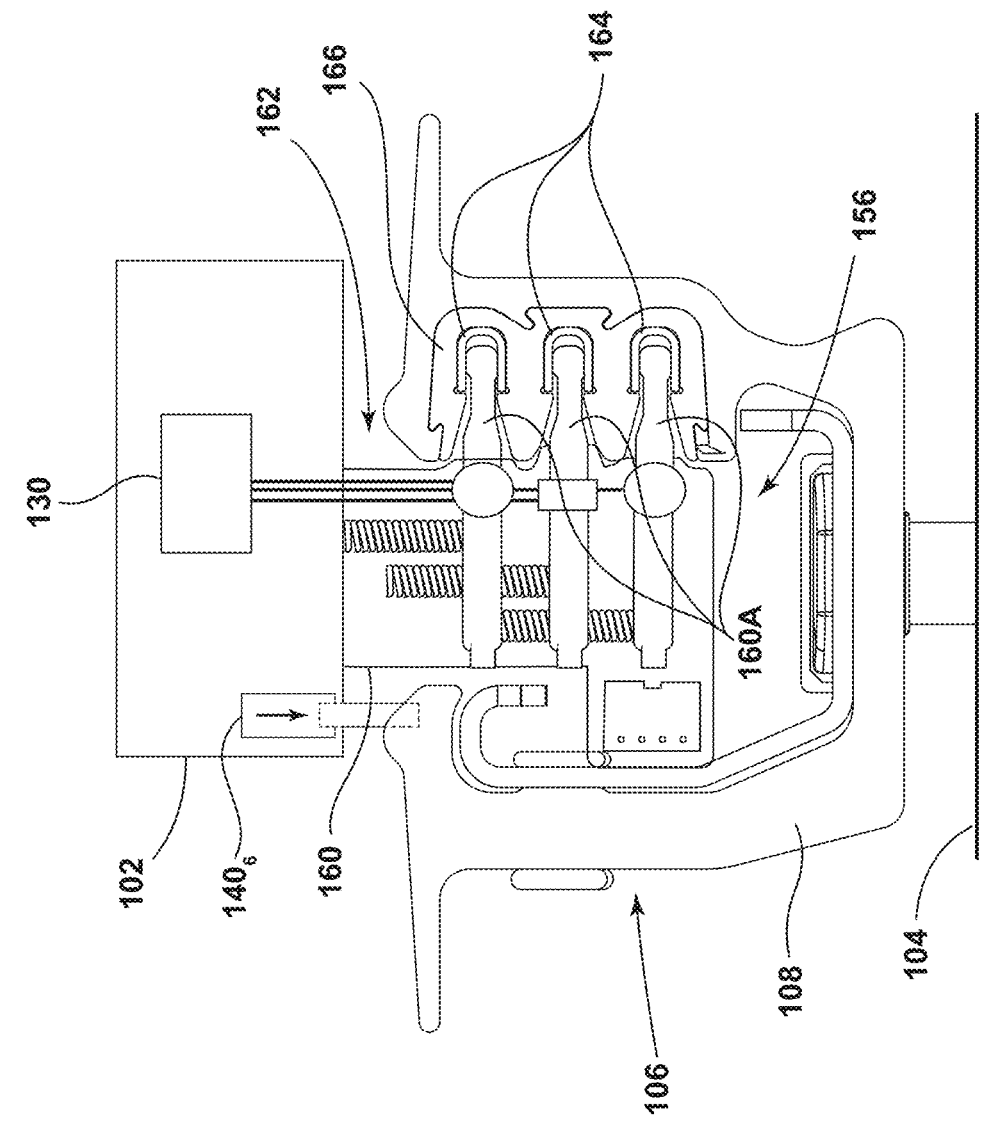
FIG. 3 is a cross sectional view generally illustrating an embodiment of a movable component and a track assembly of an electrical system according to teachings of the present disclosure.

With embodiments, such as generally illustrated in FIGS. 2 and 3, a movable component 102 may include one or more electrical components 140. An electrical component 140 may, for example and without limitation, include an electric motor 1401 (see, e.g., FIGS. 2 and 3) that may be configured to move a movable component 102 (and/or portions thereof) relative to a mounting surface 104, a fluid bladder 1402 that may be configured for adjusting a surface of a movable component 102 (e.g., lumbar support, massage, driver notification, etc.), a heating element 1403 that may be configured for heating a surface of a movable component 102 (e.g., to provide seat heating), an air mover 1404 (e.g., a fan) that may be configured to move air toward and/or away from a movable component 102 (e.g., to provide seat cooling), one or more additional ECUs 1405 (e.g., a distributed safety device/restraint ECU), and/or one or more actuators 1406 (e.g., motors, linear actuator, pyrotechnic device, etc.), among others. A movable component 102 may include one or more movable component sensors 144 that may be configured to detect movable component information of a movable component 102 (e.g., occupancy status, seat belt connection status, location, orientation, etc.). For example and without limitation, one or more movable component sensors 144 may include an occupancy sensor, a seat belt sensor, and/or a location sensor (e.g., for received signal strength indicator (RSSI) location determinations).

In embodiments, such as generally illustrated in FIGS. 1 and 4, a movable component 102 may be configured for connection with and/or removal from a mounting surface 104 in a plurality of positions and/or orientations (e.g., X-direction positions, Y-direction positions, rotational positions, a forward orientation, a rearward orientation, etc.). A movable component 102 may be configured to move along/relative to the mounting surface 104 while connected to the mounting surface 104. For example and without limitation, a movable component 102 may be selectively lockable (e.g., via an electromechanical interface 156) with a track assembly 106, such that the movable component 102 may be electrically connected with the mounting surface 104 while moving along the mounting surface 104 and/or while locked with the mounting surface 104. Additionally or alternatively, a movable component 102 may be removable from a mounting surface 104, such as in a direction substantially perpendicular to the mounting surface 104 (e.g., in a Z-direction), in a plurality of positions and/or orientations relative to the mounting surface 104 and/or the track assembly 106.

With embodiments, such as generally depicted in FIGS. 2 and 3, an electromechanical interface 156 may be configured to mechanically connect and/or electrically connect a movable component 102 with a track assembly 106. An electromechanical interface 156 may be configured to selectively permit movement of a movable component 102 relative to a mounting surface 104 (e.g., along a track 108 of a track assembly 106), such as in a direction perpendicular to a Z-direction, while restricting Z-direction movement of the movable component 102 relative to the mounting surface 104, at least in some circumstances. For example and without limitation, an electromechanical interface 156 may include one or more anchors 158 and/or electrical connectors 160 that may be movably connected to a support member 162 of the movable component 102. One or more anchors 158 may be configured to selectively restrict movement of a movable component 102 (e.g., in an X-direction, a Y-direction, and/or a Z-direction), such as by engaging a track 108 of a track assembly 106. As generally shown in FIG. 3, an electrical connector 160 and/or one or more connector portions 160A thereof may move (e.g., rotate about a rotation axis substantially parallel to a Z-direction) into and/or out of contact with one or more conductors 164 of a track assembly 106 (e.g., to establish and/or break an electrical connection between a movable component 102 and a mounting surface 104). One or more conductors 164 may be connected to (e.g., substantially fixed in) a track 108 of a track assembly 106 and/or may be electrically insulated from a track 108 by an isolator 166 (see, e.g., FIG. 3). The electrical connector 160 may, for example and without limitation, be moved/rotated manually/mechanically and/or via a powered actuator, such as a motor 1401.

In embodiments, such as generally illustrated in FIGS. 1 and 4, a second ECU 170 may be connected, directly or indirectly, to a mounting surface 104 and/or may remain substantially fixed with respect to a mounting surface 104. A second ECU 170 may be configured to communicate with a first ECU 130, such as via one or more conductors 164 and one or more electrical connectors 160/connector portions 160A, and/or via wireless communication (e.g., via one or more antennas 172 and/or a communication device 174). A second ECU 170 may, for example, be configured to provide power from a power supply 176 to a movable component 102 via a track assembly 106 and/or one or more conductors 164 thereof. The power may, for example, be provided to a movable component 102 for powering a first ECU 130, one or more electrical components 140, and/or one or more safety devices 132.

With embodiments, such as generally illustrated in FIGS. 1 and 4, a second ECU 170 may be configured to obtain dynamic event information 178, such as from a third ECU 180 and/or via one or more dynamic event sensors 182 (e.g., radar, LiDAR, acceleration sensor, location sensor, compass, etc.). A third ECU 180 and/or one or more dynamic event sensors 182 may be configured to detect a potential (or actual) dynamic event (e.g., before and/or as a dynamic event occurs). A dynamic event may, for example and without limitation, include a vehicle collision and/or a significant acceleration or deceleration event. Detecting a potential dynamic event may, for example, include detecting that a vehicle 110 is likely to collide/crash with another object or a being (e.g., based on current relative speeds, directions, locations, etc. of the vehicle 110 and/or of the obstacle/object/being).

Figure 5:
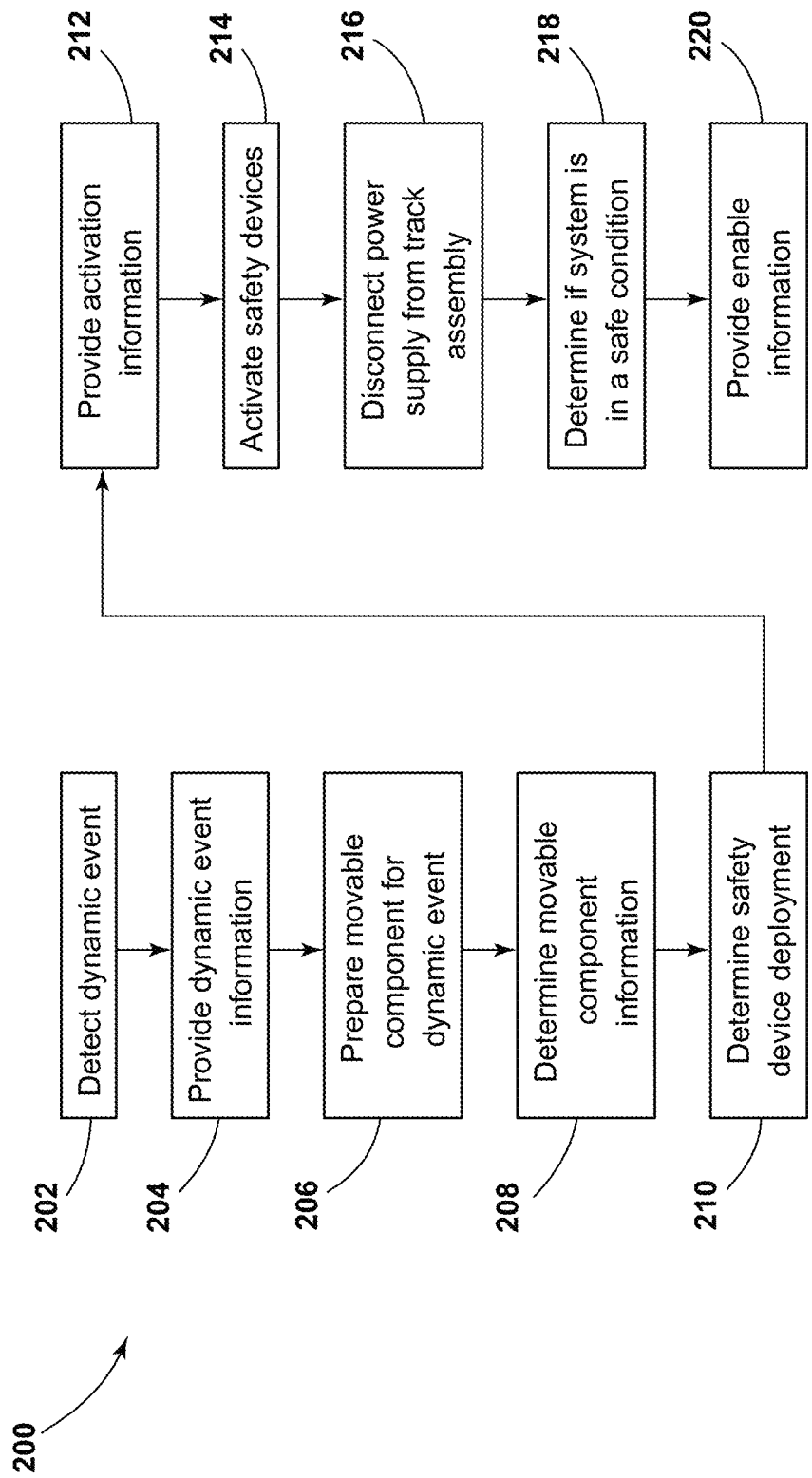
FIG. 5 is a flow diagram generally illustrating an embodiment of a method of operating an electrical system according to teachings of the present disclosure.

In embodiments, such as generally illustrated in FIG. 5, if a potential dynamic event is detected (e.g., via one or more dynamic event sensors 182), a third ECU 180 and/or one or more dynamic event sensors 182 may provide dynamic event information 178 to a second ECU 170. A second ECU 170 may be configured to provide the dynamic event information 178 to a movable component 102 and/or to a first ECU 130. Additionally or alternatively, a second ECU 170 may receive the dynamic event information 178 and provide disable information to a movable component 102 and/or a first ECU 130. The disable information may, for example and without limitation, be provided (e.g., broadcast) via one or more antennas 172 that may be connected, at least indirectly, with a mounting surface 104 and/or that may be connected (e.g., physically connected, operatively connected, communicatively connected, etc.) with one or more of the second ECU 170, the third ECU 180, and/or one or more dynamic event sensors 182. The disable information may, for example, correspond to the potential dynamic event and/or may include information (e.g., signals, commands, messages, data, etc.) for preparing a movable component 102 for a dynamic event. Preparing a movable component 102 for a dynamic event may, for example, include locking the movable component 102 with a track assembly 106 (e.g., substantially immediately via the electromechanical interface 156) and/or disabling one or more functions and/or electrical components 140 of the movable component 102.

With embodiments, an electrical system 100 may be configured to activate one or more safety devices 132 that may be connected to and/or disposed proximate a movable component 102. For example and without limitation, if a potential (or actual) dynamic event is detected, a second ECU 170 may provide activation information to a movable component 102. The activation information may be provided from a second ECU 170 to one or more safety devices 132 via the electromechanical interface 156 and/or wirelessly (e.g., broadcast via one or more antennas 172). The activation information may include information (e.g., signals, commands, messages, data, etc.) for activating one or more safety devices 132. In some circumstances, the activation information may be provided substantially directly to one or more safety devices 132 (e.g., without being routed via a first ECU 130). The activation information may activate the one or more safety devices 132. In some circumstances, the activation information and/or dynamic event information 178 may be provided to a first ECU 130, which may control activation of the one or more safety devices 132 (e.g., in a distributed configuration).

With embodiments, a second ECU 170 may be configured to disconnect a power supply 176 from a track assembly 106, such as in response to receiving dynamic event information 178 and/or after activating a safety device 132, which may, for example, facilitate avoiding a short circuit during the dynamic event.

With embodiments, activation information may be provided to a movable component 102 after disable information has been provided to the movable component 102 and/or after the movable component 102 has been disabled/locked. Providing disable information prior to activation information may facilitate disabling/locking of the movable component 102 prior to activating one or more safety devices 132.

In embodiments, a second ECU 170 may continue to provide/broadcast disable information until a dynamic event actually occurs (or is expected to occur) and/or for a period of time after a dynamic event occurs (or was expected to occur). While disable information is being provided/broadcast, a first ECU 130 may keep the movable component 102 locked with a track assembly 106 and/or disable operation of some or all functions and/or electrical components 140 of the movable component 102. Disabled operations of a movable component 102 may include one or more manual operations (e.g., operations initiated by a user via actuation of a button/lever of the movable component 102) and/or one or more automatic operations (e.g., operations initiated via one or more ECUs, voice commands, mobile device, etc.). Additionally or alternatively, a first ECU 130 may disable manual operation of some or all functions and/or electrical components 140 of a movable component 102 until a second ECU 170 provides enable information to the movable component 102 and/or the first ECU 130. For example, once a first ECU 130 receives enable information, operation of functions and/or electrical components 140 of a movable component 102 may be initiated, but, in some circumstances, previously stopped operation of functions and/or electrical components 140 may or may not be automatically resumed.

With embodiments, a second ECU 170 may be configured to provide enable information if the second ECU 170 determines/verifies that the electrical system 100 is in a safe condition. A second ECU 170 may, for example, determine that the electrical system 100 is in a safe condition, at least in part, according to (e.g., using, based on, pursuant to, etc.) input from one or more users. For example and without limitation, a second ECU 170 may provide enable information after an occupant/driver moves a vehicle key, after a vehicle occupant presses a button, and/or after an occupant provides a particular voice command/response, among others. A second ECU 170 may be configured to connect (and/or reconnect) a power supply 176 to a track assembly 106 if/when the electrical system 100 is determined to be in a safe condition.

In embodiments, a third ECU 180 may be configured to provide dynamic event information 178 (e.g., directly) to a first ECU 130, such as independently of a second ECU 170 providing disable information. Additionally or alternatively, a second ECU 170 may not provide disable information to a first ECU 130 if a third ECU 180 provides dynamic event information 178 to the first ECU 130, but a second ECU 170 may still provide activation information and/or enable information in such circumstances.

With embodiments, an electrical system 100 may include a plurality of movable components 102, some or all of which may include a first ECU 130, one or more electrical components 140, and/or one or more safety devices 132. A second ECU 170 may be configured to broadcast disable information to some or all of the plurality of movable components 102. For example and without limitation, the same disable information may be provided to all/each of the movable components 102. The first ECUs 130 of the movable components 102 may be configured to receive the disable information and/or lock the movable components 102 with a mounting surface 104 and/or a track assembly 106 in response/according to the disable information. Locking a movable component 102 with a mounting surface 104 may include activating an electromechanical interface 156 of the movable component 102 to engage the mounting surface 104 and/or a track assembly 106, which may substantially prevent movement of the movable component 102 relative to the mounting surface 104.

In embodiments, a second ECU 170 may be configured to provide activation information to one or more of the plurality of movable components 102. In some circumstances, the activation information may be provided substantially directly to one or more safety devices 132 of each movable component 102, which may activate said one or more safety devices 132 (e.g., different activation information may be provided to each movable component 102 for activating respective safety devices 132 as appropriate). In some circumstances, the activation information may be provided to a first ECU 130 of some or each of the movable components 102, which may then control activation of the one or more safety devices 132 of the respective movable component 102 independently of the other movable components 102 (e.g., the same activation information may be provided to each movable component 102 and the first ECUs 130 may determine how to activate the respective one or more safety devices 132 substantially independently of one another).

With embodiments, a first ECU 130 may be configured to provide movable component information (e.g., occupancy status, seat belt connection status, location, orientation, etc.), which may be obtained via a status and/or reading of one or more movable component sensors 144, to a second ECU 170 and/or a third ECU 180, such as via a communication device 174. A communication device 174 may, for example and without limitation, include a receiver, a transmitter, a transceiver, and/or other components. A first ECU 130, a second ECU 170, and/or a third ECU 180 (or a safety device module incorporated therewith) may, for example, determine how to deploy safety devices 132 according to the movable component information.

In embodiments, one or more of ECUs 130, 170, 180 may be configured to determine the manner in which one or more safety devices 132 should be deployed (e.g., to make a safety device deployment determination), for example, to provide an optimal amount of protection to one or more occupants of the vehicle 110. An ECU 130, 170, 180 and/or a safety device 132 may make a safety device deployment determination based on a variety of factors including, without limitation, movable component information (e.g., occupancy status, seat belt connection status, location, orientation, etc.) of one or more movable components 102, vehicle 110 information (e.g., vehicle speed, interior layout of the vehicle 110, arrangement and/or orientation of one or more movable components 102 relative to one another, vehicle 110 specifications, etc.), dynamic event information 178 (e.g., object/being speed, estimated time to dynamic event, estimated forces produced by dynamic event, etc.), environmental information (e.g., weather/road conditions, traffic levels, nearby objects/beings which could potentially cause a secondary dynamic event, etc.), and/or other available or stored information (e.g., estimated occupant displacement based on the type of dynamic event, such as a side impact, rear impact, front impact, crash testing information/statistics, etc.). As such, movement of a movable component 102 during a safety device deployment determination may impair the determination (e.g., if a determination is made while the movable component 102 is in a first position, but the movable component 102 is in a second position when a safety device 132 is actually deployed).

With embodiments, if a potential dynamic event is detected, a second ECU 170 may be configured to provide disable information to a first ECU 130 of a movable component 102, and the first ECU 130 may substantially immediately stop movement of and/or fix a position/orientation of the movable component 102. A deployment determination may then be made, at least in part, according to the stopped/locked position of the movable component 102. If a potential dynamic event is not detected, a movable component 102 may be moved, connected, and/or removed in substantially an unlimited number of configurations (e.g., even while a vehicle 110 is in motion, at least in some circumstances).

In embodiments, such as generally illustrated in FIG. 5, a method 200 of operating an electrical system 100 may include detecting a dynamic event such as, for example, via one or more dynamic event sensors 182 and/or a third ECU 180 (which may be an integral part of the dynamic event sensors 182 and/or connected thereto) at block 202. Detecting a dynamic event may include detecting a potential dynamic event (e.g., before it occurs) and/or detecting an actual dynamic event (e.g., when a dynamic event is initiated and/or as a dynamic event occurs). Detecting a dynamic event may include, for example and without limitation, detecting a vehicle collision and/or significant acceleration/deceleration event (e.g., acceleration/deceleration above a threshold/outside a predetermined range). Detecting a vehicle collision may include detecting that a vehicle 110 is likely to collide/crash with another object or a being (e.g., based on current relative speeds, directions, locations, etc. of the vehicle 110 and/or of the obstacle/object/being).

With embodiments, the method 200 may include, at block 204, providing dynamic event information 178 (e.g., information about the detected dynamic event) via a third ECU 180 and/or one or more dynamic event sensors 182 in response to detecting a dynamic event at block 202. Providing dynamic event information 178 may include sending and/or broadcasting the dynamic event information 178 via one or more antennas 172 operatively connected (e.g., communicatively connected) to the third ECU 180 and/or one or more sensors 182. Providing dynamic event information 178 may include providing the dynamic event information 178 to the second ECU 170 via a third ECU 180 and/or one or more dynamic event sensors 182. Providing dynamic event information 178 may include providing the dynamic event information 178 indirectly to one or more (e.g., all) movable components 102 and/or first ECUs 130 via a second ECU 170 (e.g., wirelessly and/or via an electromechanical interface 156), such as in response to receiving the dynamic event information 178 from a third ECU 180 and/or dynamic event sensor 182. Additionally and/or alternatively, providing dynamic event information 178 may include providing the dynamic event information 178 directly to one or more (e.g., all) movable components 102 and/or first ECUs 130 via a third ECU 180 and/or one or more dynamic event sensors 182. In some embodiments, providing dynamic event information 178 may include providing disable information to a movable component 102 and/or a first ECU 130 via a second ECU 170, even if dynamic event information 178 is provided directly to a movable component 102 and/or a first ECU 130 from a third ECU 180 and a dynamic event sensor 182. Providing disable information via the second ECU 170 may include continuously providing/broadcasting the disable information until a dynamic event occurs (or is expected to occur) and/or for a period of time after a dynamic event occurs (or was expected to occur).

With embodiments, the method 200 may include, at block 206, preparing one or more (e.g., all) movable components 102 for a dynamic event (e.g., the detected dynamic event), such as via one or more first ECUs 130, in response to receiving the dynamic event information 178 and/or the disable information. Preparing a movable component 102 for a dynamic event may, for example, include disabling operation of one or more functions and/or electrical components 140 of the movable component 102 via a first ECU 130 (e.g., based on the dynamic event information 178 and/or the disable information) in response to receiving the disable information. Disabling operation of a movable component 102 may include disabling one or more manual operations (e.g., operations initiated by a user via actuation of a button/lever of the movable component 102) and/or one or more automatic operations (e.g., operations initiated via one or more ECUs 130, 170, 180, voice commands, mobile device, etc.). Disabling operation of a movable component 102 may include maintaining a movable component 102 in a disabled state while the disable information is being provided/broadcasted via a second ECU 170 and/or until the movable component 102 and/or its first ECU 130 receives enable information, such as from a second ECU 170 and/or a third ECU 180.

With embodiments, preparing a movable component 102 for a dynamic event at block 206 may, additionally or alternatively, include stopping movement of the movable component 102 (e.g., immediately) and/or locking the movable component 102 with a track assembly 106 (e.g., via an electromechanical interface 156), such as to restrict and/or substantially prevent movement of the movable component 102 relative to a mounting surface 104. Locking the movable component 102 with a track assembly 106 may include fixing a position and/or orientation of the movable component 102 relative to the mounting surface 104. Locking the movable component 102 with a track assembly 106 (e.g., via a electromechanical interface 156) may include engaging one or more anchors 158 with a track assembly 106 of the mounting surface 104 and/or may include establishing and/or maintaining an electrical connection between the movable component 102 and the mounting surface 104, such as via adjusting an electrical connector 160/connector portion(s) 160A into contact with one or more conductors 164 of a track assembly 106. In some configurations, the connector portion(s) 160A may remain in electrical contact with one or more conductors 164 while the movable component 102 is moving and when the movable component 102 is fixed. An electromechanical interface 156 may, for example and without limitation, include and/or be connected (e.g., operatively) to one or more electrical components 140, such as one or more actuators 1406 that may be configured to cause and/or facilitate movement/adjustment of an electrical connector 160 and/or one or more anchors 158 (see, e.g., FIG. 2). In some configurations, an electromechanical interface 156 may include an actuator 1406 that may include an electric motor operatively connected to one or more anchors 158, such as to move the one or more anchors 158 between engaged/locked and disengaged/unlocked positions. Locking a movable component 102 with a track assembly 106 may include operating the actuator 1406 (e.g., rotating a motor) to move one or more anchors 158 into an engaged/locked position with the track assembly 106.

Additionally or alternatively, an electromechanical interface 156 may include an actuator 1406 that may include a pyrotechnic device (e.g., a piston) that may be configured to (i) move the one or more anchors 158 between engaged/locked and disengaged/unlocked positions (see, e.g., FIG. 2), and/or (ii) directly engage a track assembly 106 to restrict and/or prevent movement of the movable component 102 relative to the track assembly 106 (see, e.g., FIG. 3). Locking a movable component 102 with a track assembly 106 may include operating the actuator 1406 (e.g., activating a pyrotechnic device) to (i) move one or more anchors 158 into an engaged/locked position with the track assembly 106, and/or (ii) directly engage the track assembly 106.

With embodiments, the method 200 may include, at block 208, detecting movable component information (e.g., occupancy status, seat belt connection status, location, orientation, etc.) of one or more (e.g., all) movable components 102 via one or more movable component sensors 144 (e.g., an occupancy sensor, a seat belt sensor, a location sensor, etc.). Detecting movable component information may include providing the detected movable component information to a first ECU 130, a second ECU 170, and/or a third ECU 180.

With embodiments, the method 200 may include, at block 210, making a safety device deployment determination via a second ECU 170 and/or a third ECU 180. Making a safety device deployment determination may include, for example, determining which safety devices 132, if any, should be deployed and/or when such safety devices 132 should be deployed to provide an optimal amount of protection to one or more occupants of the vehicle 110. Making a safety device deployment determination may include considering a variety of factors such as the movable component information received from the first ECU 130, the dynamic event information 178, vehicle 110 information, environmental information, and/or other information that may be stored and/or accessible by the second ECU 170 and/or the third ECU 180.

With embodiments, the method 200 may include, at block 212, providing activation information to one or more (e.g., all) movable components 102, first ECUs 130, and/or safety devices 132, such as via a second ECU 170 and/or a third ECU 180. Providing activation information may include providing the activation information directly to one or more safety devices 132. Providing activation information may include providing instructions for activating one or more (e.g., a subset, all, etc.) safety devices 132 to one or more first ECUs 130 according to the safety device deployment determination. Providing activation information may, additionally and/or alternatively, include providing the same activation information to one or more movable components 102 and/or first ECUs 130. With such a configuration, some or all of the first ECUs 130 may make a safety device deployment determination at least partially independent of one another, which may include one or more of the same processes described above with respect to block 210.

With embodiments, the method 200 may include, at block 214, activating one or more safety devices 132 according to the activation information. In at least some examples, such as when one or more conditions are not met (e.g., a detected potential dynamic event does not actually occur), one or more safety devices 132 (e.g., an airbag 134, a pyrotechnic device 136, etc.) may not be activated.

With embodiments, the method 200 may include, at block 216, disconnecting a power supply 176 from a track assembly 106 via a second ECU 170, such as after a dynamic event occurs and/or after one or more safety devices 132 are activated at block 214. In examples, when one or more conditions are not met (e.g., a detected potential dynamic event does not actually occur, one or more safety devices 132 are not activated, etc.), the power supply 176 may not be disconnected from a track assembly 106 (e.g., the method 200 may skip block 216).

With embodiments, the method 200 may include, at block 218, determining whether the electrical system 100 is in a safe condition, such as via a second ECU 170. Determining whether the electrical system 100 is in a safe condition may include receiving an input from a user (e.g., moving a vehicle key, pressing a button, providing a particular voice command/response, etc.).

With embodiments, the method 200 may include, at block 220, providing enable information, such as via a second ECU 170, in response to determining that the electrical system 100 is in a safe condition at block 216. Providing enable information may include providing enable information to one or more movable components 102 and/or first ECUs 130 to enable/restore operation of one or more functions and/or electric components 140 of a movable component 102 (e.g., that were disabled at block 206 and/or that are still in safe operating condition after the dynamic event). Providing enable information may, additionally and/or or alternatively, include connecting and/or reconnecting a power supply 176 to a track assembly 106 via a second ECU 170.

In examples, an ECU (e.g., the first ECU 130, the second ECU 170, the third ECU 180, etc.) may include an electronic controller and/or include an electronic processor, such as a programmable microprocessor and/or microcontroller. In embodiments, an ECU may include, for example, an application specific integrated circuit (ASIC). An ECU may include a central processing unit (CPU), a memory (e.g., a non-transitory computer-readable storage medium), and/or an input/output (I/O) interface. An ECU may be configured to perform various functions, including those described in greater detail herein, with appropriate programming instructions and/or code embodied in software, hardware, and/or other medium. In embodiments, an ECU may include a plurality of controllers. In embodiments, an ECU may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that an electronic control unit (ECU), a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. An electrical system, comprising:
a movable component configured for selective connection with and selective removal from a mounting surface, the movable component including:
a first electronic control unit (ECU); and
an electromechanical interface configured for selectively locking the movable component relative to said mounting surface;
a second ECU configured to communicate with the first ECU; and
a third ECU configured to detect a potential dynamic event via one or more sensors;
wherein the third ECU is configured to provide dynamic event information to the first ECU and/or the second ECU; and wherein at least one of:
the second ECU is configured to provide disable information, which corresponds to the dynamic event information, to the movable component; and
the first ECU is configured to lock the movable component with said mounting surface according to the disable information and/or the dynamic event information.

2. The electrical system of claim 1, wherein the first ECU is configured to lock the movable component with said mounting surface and disable one or more electrical components of the movable component according to the disable information.

3. The electrical system of claim 1, wherein:
the movable component includes a movable component sensor configured to obtain movable component information;
the first ECU is configured to provide the movable component information to the second ECU; and
the second ECU is configured to make a safety device deployment determination according to the movable component information.

4. The electrical system of claim 3, wherein:
the first ECU is configured to lock the movable component with said mounting surface according to the disable information; and
the second ECU is configured to make the safety device deployment determination based at least partially on a position in which the movable component is locked relative to said mounting surface via the first ECU.

5. The electrical system of claim 1, including one or more additional movable components configured for selective connection with and for selective removal from said mounting surface;
wherein the movable component and the one or more additional movable components are configured to move along a track assembly of said mounting surface.

6. The electrical system of claim 1, wherein the movable component is configured for connection with a track assembly of said mounting surface in a forward orientation and a rearward orientation.

7. The electrical system of claim 1, wherein the electromechanical interface includes:
one or more anchors configured to lock the movable component with a track assembly connected to said mounting surface; and
an electrical connector configured to rotate into and out of electrical contact with a conductor of said track assembly.

8. A method of operating an electrical system, the method comprising:
detecting a potential dynamic event;
providing disable information to a movable component configured for connection with, removal from, and movement along a track assembly connected to a mounting surface;
locking the movable component relative to the mounting surface in response to the disable information;
providing activation information to the movable component;
after locking the movable component, activating a safety device associated with the movable component according to the activation information;
disconnecting a power source from the track assembly after activating the safety device;
determining whether the electrical system is in a safe condition;
providing enable information to the movable component if the electrical system is in the safe condition; and
connecting the power source with the track assembly if the electrical system is in the safe condition;
wherein the safety device includes one or more of an airbag, a seatbelt pretensioner, or a pyrotechnic device.

9. The method of claim 8, including:
providing the disable information to a plurality of other movable components; and
locking the plurality of other movable components relative to the mounting surface in response to the disable information;
wherein the movable component and the plurality of other movable components comprise respective seats.

10. The method of claim 8, wherein providing the disable information to the movable component includes broadcasting the disable information via one or more antennas to the movable component and one or more other movable components.

11. The method of claim 8, wherein locking the movable component includes activating an electromechanical interface of the movable component to engage the track assembly and substantially prevent movement of the movable component relative to the mounting surface.

12. The method of claim 8, wherein:
the disable information corresponds to the potential dynamic event;
the mounting surface is a portion of a vehicle; and
the potential dynamic event includes a vehicle collision.

13. The method of claim 8, wherein the disable information is provided to the movable component before the activation information is provided to the movable component.

14. The method of claim 8, including disabling manual and automatic operation of the movable component when the movable component receives the disable information and/or until the movable component receives enable information.

15. The method of claim 14, wherein:
the movable component includes a seat having one or more electrical components; and
disabling manual and automatic operation includes disabling manual operation of the one or more electrical components.

16. The method of claim 15, wherein the one or more electrical components include at least one of an electric motor, a heating element, a fluid bladder, and/or an air mover.

17. A vehicle electrical system, comprising:
a mounting surface;
a track assembly connected to the mounting surface and include a conductor;
a movable component configured for selective connection with, movement along and relative to, and selective vertical removal from the track assembly, the movable component including:
a seat;
a safety device including at least one of a seat belt pretensioner, an airbag, or a pyrotechnic device;
a first electronic control unit (ECU); and
an electromechanical interface configured for selectively locking the movable component relative to the track assembly;
a second ECU configured to communicate with the first ECU; and
a third ECU configured to detect a potential dynamic event via one or more sensors;

wherein the third ECU is configured to provide dynamic event information to the first ECU and/or the second ECU; and at least one of:
  the first ECU is configured to lock the movable component with said mounting surface according to information from the second ECU and/or the dynamic event information, or
  the second ECU is configured to provide disable information, which corresponds to the dynamic event information, to the movable component.

18. The vehicle electrical system of claim 17, wherein:
the first ECU is configured to lock the movable component with said mounting surface and disable one or more electrical components of the movable component according to the disable information;
the mounting surface comprises a vehicle floor;
the movable component includes a movable component sensor configured to obtain movable component information;
the first ECU is configured to provide the movable component information to the second ECU;
the second ECU is configured to make a safety device deployment determination for the safety device according to the movable component information;
the second ECU is configured to make the safety device deployment determination based at least partially on a position along the track assembly in which the movable component is locked;
the second ECU is configured to disconnect the track assembly from a power supply;
the movable component is configured for connection with the track assembly of in a forward orientation and a rearward orientation; and
the electromechanical interface includes:
  one or more anchors configured to lock the movable component with the track assembly; and
  an electrical connector configured to rotate into and out of electrical contact with the conductor of the track assembly.

* * * * *